(12) United States Patent
Wu et al.

(10) Patent No.: US 8,205,173 B2
(45) Date of Patent: Jun. 19, 2012

(54) PHYSICAL FAILURE ANALYSIS GUIDING METHODS

(75) Inventors: Sunny Wu, Zhudong Town (TW);
Yen-Di Tsen, Chung-Ho (TW);
Monghsung Chuang, Hsin-Chu (TW);
Fu-Min Huang, Hsin-Chu (TW); Jo Fei Wang, Hsin-Chu (TW); Jong-I Mou, Hsinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 128 days.

(21) Appl. No.: 12/818,003

(22) Filed: Jun. 17, 2010

(65) Prior Publication Data

US 2011/0314336 A1   Dec. 22, 2011

(51) Int. Cl.
*G06F 17/50* (2006.01)
*G06F 19/00* (2006.01)
*G06F 11/00* (2006.01)
*G01R 31/00* (2006.01)

(52) U.S. Cl. ............ 716/52; 716/54; 716/111; 716/136; 703/14; 710/110; 382/145; 382/149; 382/154; 702/59; 702/120; 324/501; 324/754.01; 324/762.02; 324/762.05; 714/33; 714/46; 714/724

(58) Field of Classification Search .................... 716/52, 716/54, 111, 136; 703/14; 700/110; 382/145, 382/149, 154; 702/59, 120; 324/501, 754.01, 324/762.02, 762.05; 714/33, 46, 724
See application file for complete search history.

(56) References Cited

U.S. PATENT DOCUMENTS

| | | | | |
|---|---|---|---|---|
| 4,618,938 A * | 10/1986 | Sandland et al. | | 382/148 |
| 4,725,773 A * | 2/1988 | Lieneweg | | 324/73.1 |
| 5,103,557 A * | 4/1992 | Leedy | | 438/6 |
| 5,519,193 A * | 5/1996 | Freiermuth et al. | | 219/678 |
| 5,991,699 A * | 11/1999 | Kulkarni et al. | | 702/83 |
| 6,096,093 A * | 8/2000 | Caywood et al. | | 438/16 |
| 6,154,714 A * | 11/2000 | Lepejian | | 702/118 |
| 6,259,960 B1 * | 7/2001 | Inokuchi | | 700/110 |
| 6,320,391 B1 * | 11/2001 | Bui | | 324/537 |
| 6,414,508 B1 * | 7/2002 | London | | 324/762.05 |
| 6,542,830 B1 * | 4/2003 | Mizuno et al. | | 702/35 |
| 6,574,760 B1 * | 6/2003 | Mydill | | 714/724 |
| 6,753,524 B2 * | 6/2004 | Matsui et al. | | 850/9 |
| 6,768,329 B1 * | 7/2004 | Dosdos et al. | | 324/756.05 |
| 6,948,141 B1 * | 9/2005 | Satya et al. | | 716/52 |
| 6,987,873 B1 * | 1/2006 | Ben-Porath et al. | | 382/145 |
| 7,760,929 B2 * | 7/2010 | Orbon et al. | | 382/148 |
| 2003/0135295 A1 * | 7/2003 | Dor et al. | | 700/108 |
| 2003/0206027 A1 * | 11/2003 | Nozoe et al. | | 324/751 |
| 2004/0252879 A1 * | 12/2004 | Tiemeyer et al. | | 382/145 |
| 2005/0097481 A1 * | 5/2005 | Mitsutake et al. | | 716/2 |
| 2006/0010416 A1 * | 1/2006 | Keck et al. | | 716/19 |
| 2006/0078189 A1 * | 4/2006 | Hosoya et al. | | 382/149 |
| 2009/0288057 A1 * | 11/2009 | Pirkle et al. | | 716/16 |
| 2010/0135568 A1 * | 6/2010 | Preil et al. | | 382/144 |
| 2011/0188733 A1 * | 8/2011 | Bardos et al. | | 382/149 |
| 2011/0194752 A1 * | 8/2011 | Pang | | 382/149 |

* cited by examiner

*Primary Examiner* — Phallaka Kik
(74) *Attorney, Agent, or Firm* — Slater & Matsil, L.L.P.

(57) ABSTRACT

A method includes providing a plurality of failure dies, and performing a chip probing on the plurality of failure dies to generate a data log comprising electrical characteristics of the plurality of failure dies. An automatic net tracing is performed to trace failure candidate nodes in the failure dies. A failure layer analysis is performed on results obtained from the automatic net tracing. Physical failure analysis (PFA) samples are selected from the plurality of failure dies using results obtained in the step of performing the failure layer analysis.

20 Claims, 5 Drawing Sheets

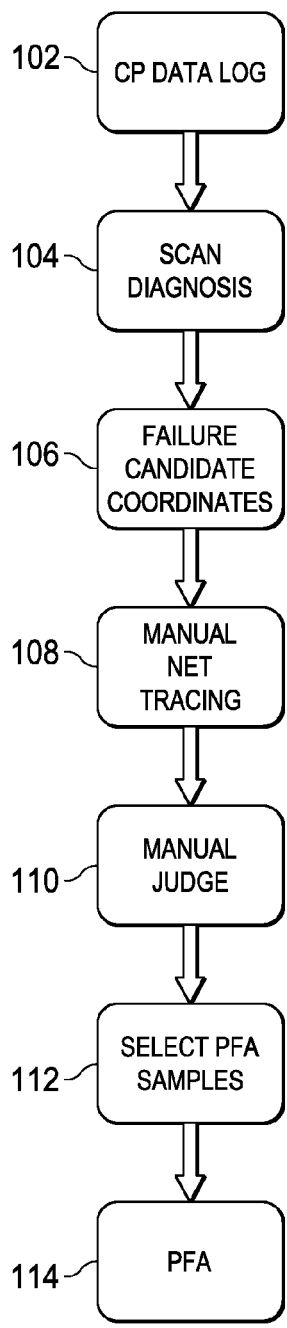
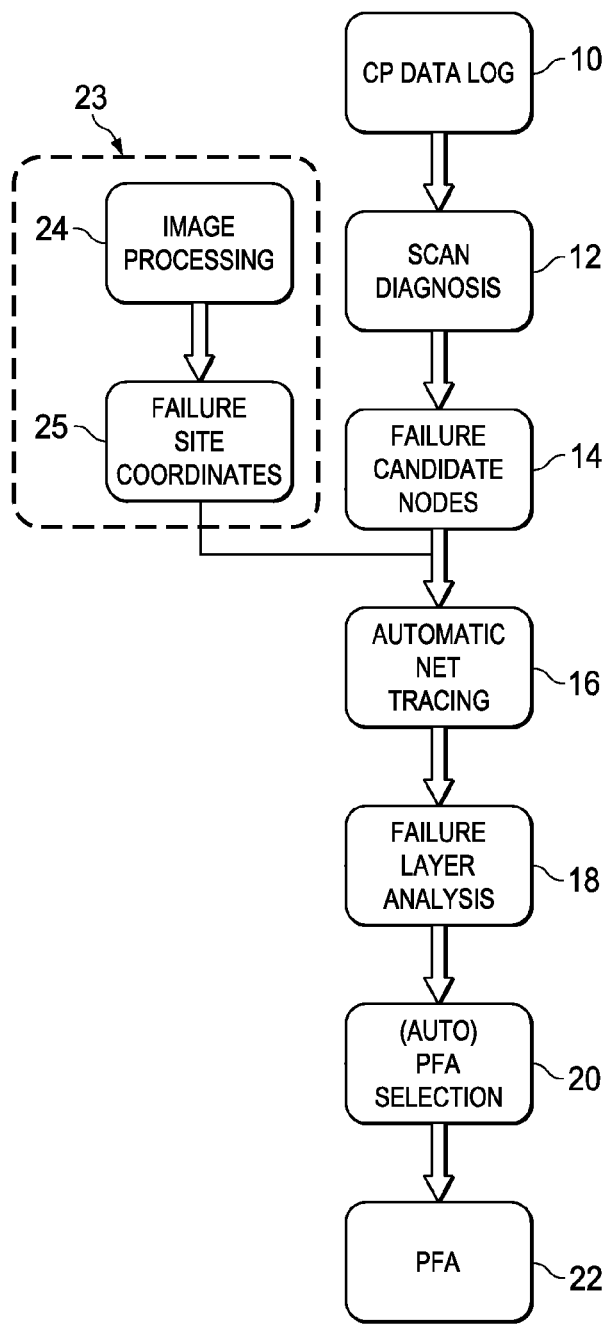
FIG. 1 (PRIOR ART)
FIG. 4

PHYSICAL FAILURE ANALYSIS GUIDING METHODS

TECHNICAL FIELD

This disclosure relates generally to integrated circuit manufacturing processes, and more particularly to physical failure analysis (PFA) guiding methods.

BACKGROUND

The yield in the manufacturing of integrated circuits is affected by many factors. To improve the yield, physical failure analysis (PFA) needs to be performed on at least some of failure dies to find out the root cause of the problems. Since the failure dies may have various different problems, the major failure that affects the yield most needs to be found as a high priority.

The selection of appropriate PFA samples from the failure dies thus becomes critical for catching major failures, and for the process optimization. FIG. 1 illustrates the work flow of a conventional method for selecting PFA samples. First, in step 102, the electrical characteristics of the failure dies are tested, which step is known as a chip probing (CP) step. A CP data log is established to store the results. Next, as shown in step 104, software is used to do a scan diagnosis, in which problems appearing in the failure dies are simulate. If the simulated problems fit the CP data, the simulated problems are identified as being failure candidates. The identified failure candidates in each of the failure dies are provided in the format of coordinates in the respective dies (step 106). For example, FIG. 2 is a schematic top view of an area of a failure die, wherein some metal lines and polysilicon lines are illustrated. Point 120 is the reported coordinate of one of the failure candidates.

To find out the actual location of the problem in the respective failure die, frame 122 (FIG. 2) is drawn with failure candidate 120 as the center, and a manual net tracing (step 108 in FIG. 1) is launched to perform a trace starting from each of the nodes (the black squares) in frame 122. The net tracing results are analyzed to determine the layer the failures occur in (step 110), and engineers may make a manual judgment to the net tracing results. Engineers then select PFA samples (step 112) from those dies whose failures occur at same places (layers). As a result, the selection of the PFA samples is affected by the experience of the engineers. PFA is then performed to the selected PFA samples (Step 114).

If the PFA samples are not properly selected, different PFA samples may reveal different problems that are not convergent. This means that the major failure is not found. Although increasing the number of PFA samples may increase the hit rate of the major failure, it is unrealistic to perform PFA on all failure dies. Conventionally, with the low efficiency of the manual net tracing and the manual analysis, only a very small percent of failure candidates can be analyzed. This significantly affects the accuracy in the selection of proper PFA samples.

SUMMARY

In accordance with one aspect, a method includes providing a plurality of failure dies, and performing a chip probing on the plurality of failure dies to generate a data log comprising electrical characteristics of the plurality of failure dies. An automatic net tracing is performed to trace failure candidate nodes in the failure dies. A failure layer analysis is performed on results obtained from the automatic net tracing. Physical failure analysis (PFA) samples are selected from the plurality of failure dies using results obtained in the step of performing the failure layer analysis.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 illustrates a work flow in a conventional process for selecting physical failure analysis (PFA) samples;

FIG. 4 illustrates a work flow in a process for selecting PFA samples in accordance with an embodiment;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of selecting physical failure analysis (PFA) samples to guide the PFA is provided in accordance with various embodiments. In the embodiments, a plurality of failure dies is provided. The failure dies may have different failures, with some major failures affecting the yield of manufacturing processes more than some other minor failures. The PFA is used to verify and identify the major failures as a priority task, so that the yield may be improved. It is realized, however, that the minor failures also appear in the failure dies. If the PFA samples are properly selected, then all, or most of, the PFA samples are convergent and may reveal the major failures. If the PFA samples are not properly selected, however, the PFA samples are not convergent and may reveal different failures. A method of improving the hit rate of the major failure is thus provided in accordance with embodiments.

Figure 2:
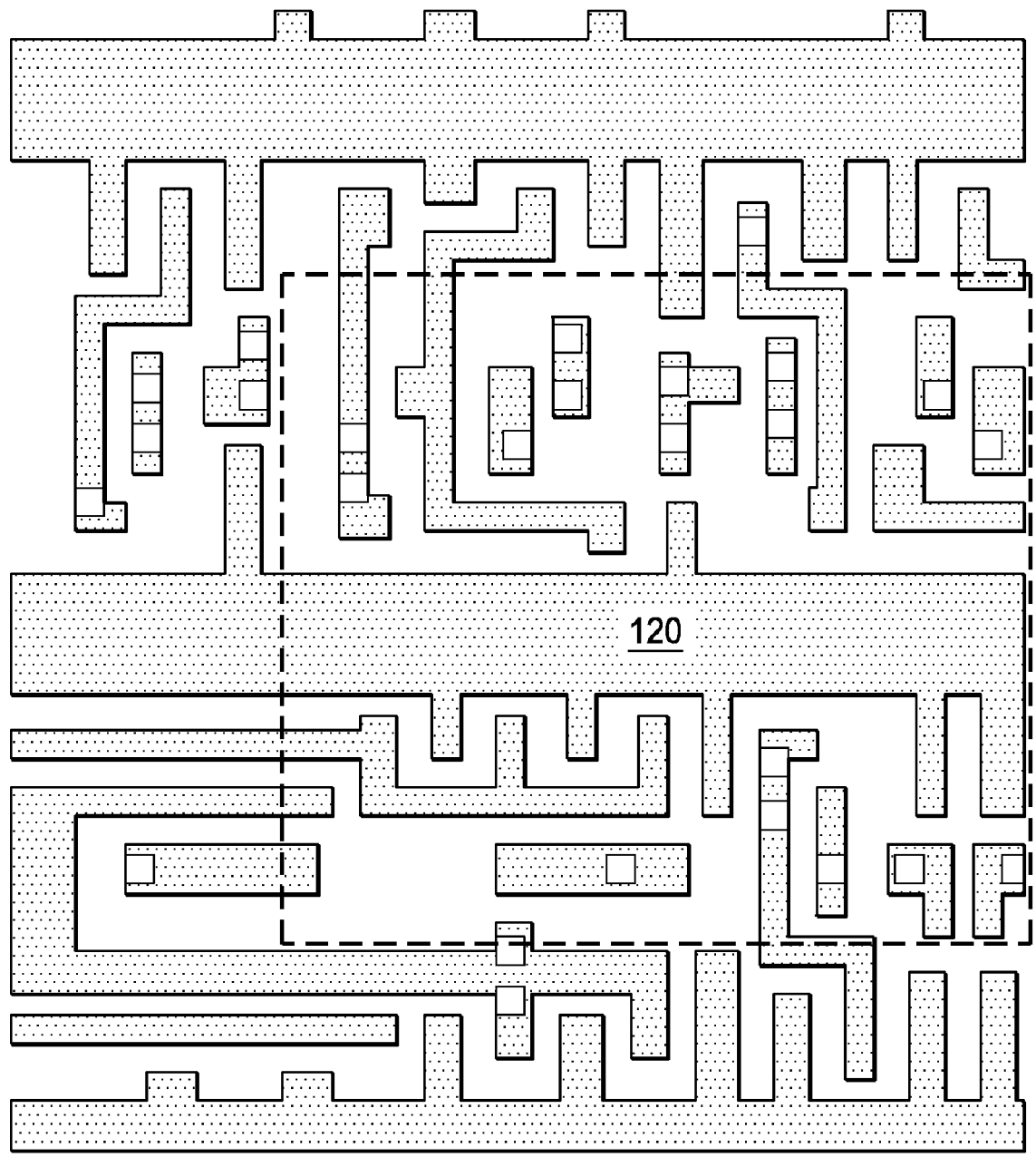
FIG. 2 illustrates a top view of an exemplary failure die, with a failure candidate coordinate marked therein.
Figure 3:
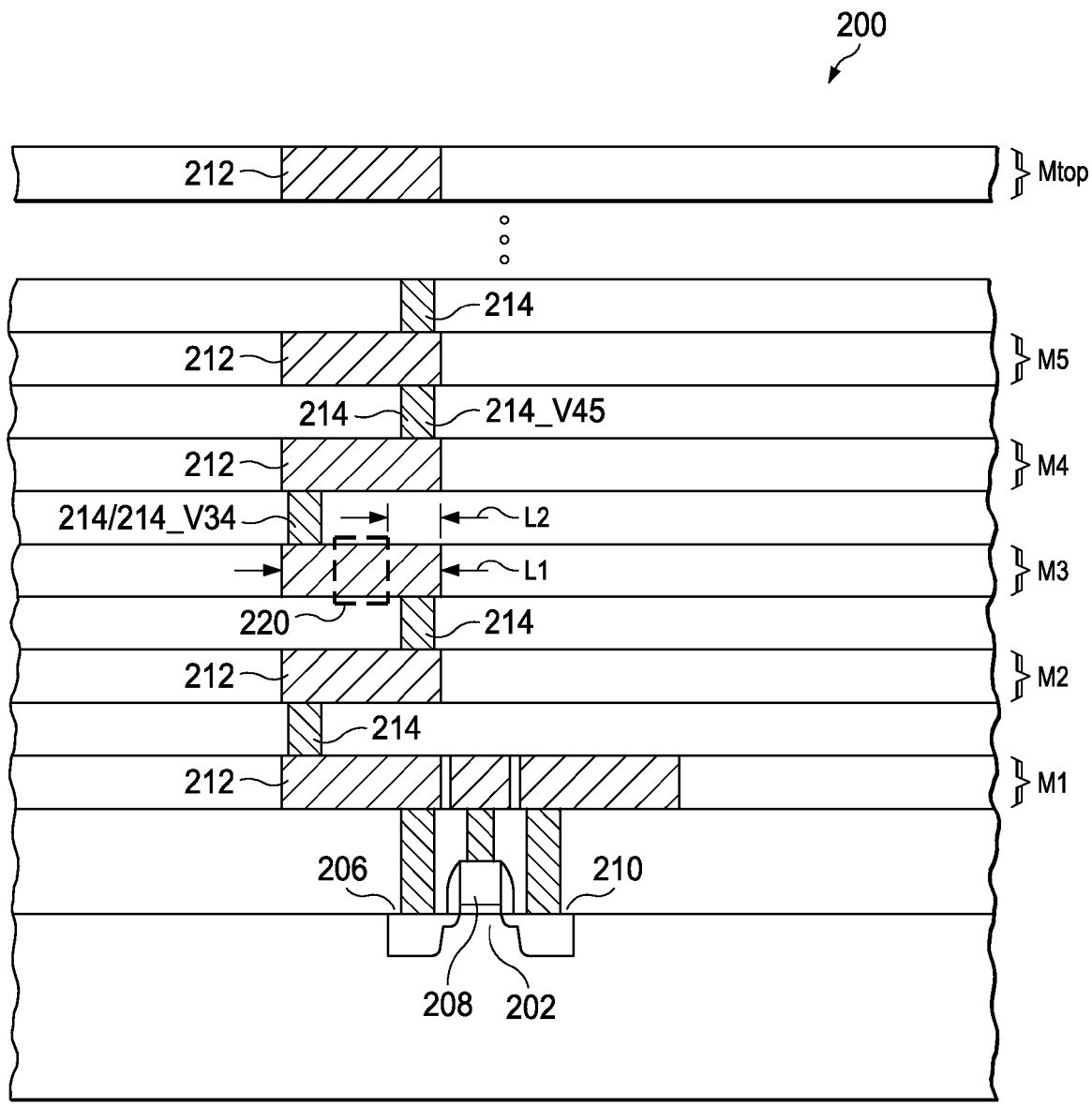
FIG. 3 illustrates a cross-sectional view of a failure die including a plurality of metal layers.

FIG. 3 illustrates a cross-sectional view of exemplary die 200, which includes a plurality of transistors (symbolized by transistor 202). Transistor 202 includes drain 206, gate 208, and source 210. A plurality of metal lines 212 and vias 214 are formed in metal layers M1 (the bottom metal layer), M2, M3, M4, M5 . . . and Mtop (the top metal layer of die 200), and may be electrically coupled to transistor 202. In the exemplary embodiment shown in FIG. 3, metal lines 212 and vias 214 are electrically coupled to drain 206.

FIG. 4 illustrates a work flow of an embodiment. First, in step 10, a chip probing (CP) is performed on the failure dies (such as die 200 in FIG. 3) to measure the electrical characteristics the failure dies. A CP data log is established to store the results into a storage media such as a hard drive. Next, as shown in step 12, software is used to perform a scan diagnosis, in which the problems in the failure dies are simulated. The behavior of the simulated circuit is compared with the CP data log. If the behavior of the simulated problems matches the data in CP data and matches the failures, then the simulated problems are failure candidates.

Failure candidate nodes are then determined (step 14) from the failure candidates. To identify the failure candidate nodes (instead of the failure coordinates that are associated with regions in which the failures occur), a further analysis needs to be performed using the scan diagnosis result and the CMP data log. The task of identifying failure candidate nodes may be performed by a software running on a computer (not shown), for example. The failure candidate nodes may be the drains, for example, drain 206 in FIG. 3, of transistors, although they may be other components of circuits such as sources and/or gates of transistors. Each of the failure candidate nodes is electrically coupled to (associated with) at least one failure site, which failure site is the location causing the failure. The failure site may be a front-end-of-line site, which is under metal layer M1 (FIG. 3) and may be in transistors and the underlying layers. The failure site may also be a back-end-of-line site, which is in one of metal layers M1 through Mtop (FIG. 3) or overlying layers. A failure site may be an open circuit in a metal line, in a via, or in another integrated circuit component. Starting from the failure candidate nodes and tracing the metal lines and vias (which may form a net), the failure site for each of the failure candidate nodes may be found.

For example, referring back to FIG. 3, metal line 212 in metal layer M3 is electrically coupled to failure candidate node 206. If metal line 212 in M3 is broken, metal line 212 in metal layer M4 and via 214_V34 will not have the electrical signal of failure candidate node 206. Therefore, through the analysis of the CP data, node 206 can be identified as a failure candidate node.

Failure candidate nodes may also be identified using hot spot analysis (block 23 in FIG. 4). Signals may be applied on failure dies, and emission microscopy (EMMI) images are taken, wherein problematic spots in the failure dies may be shown as hot spots (brighter spots) through an image processing (step 24 in FIG. 4). The hot spots are identified in the form of failure site coordinates (step 25 in FIG. 4) in the failure dies. The coordinates are then converted to failure candidate nodes in the failure dies, which failure candidate nodes have the same coordinates as the hot spots. The failure candidate nodes obtained through the scan diagnosis and the failure candidate nodes obtained through the hot spot identification may be combined and used for the subsequent automatic net tracing.

Figure 5:
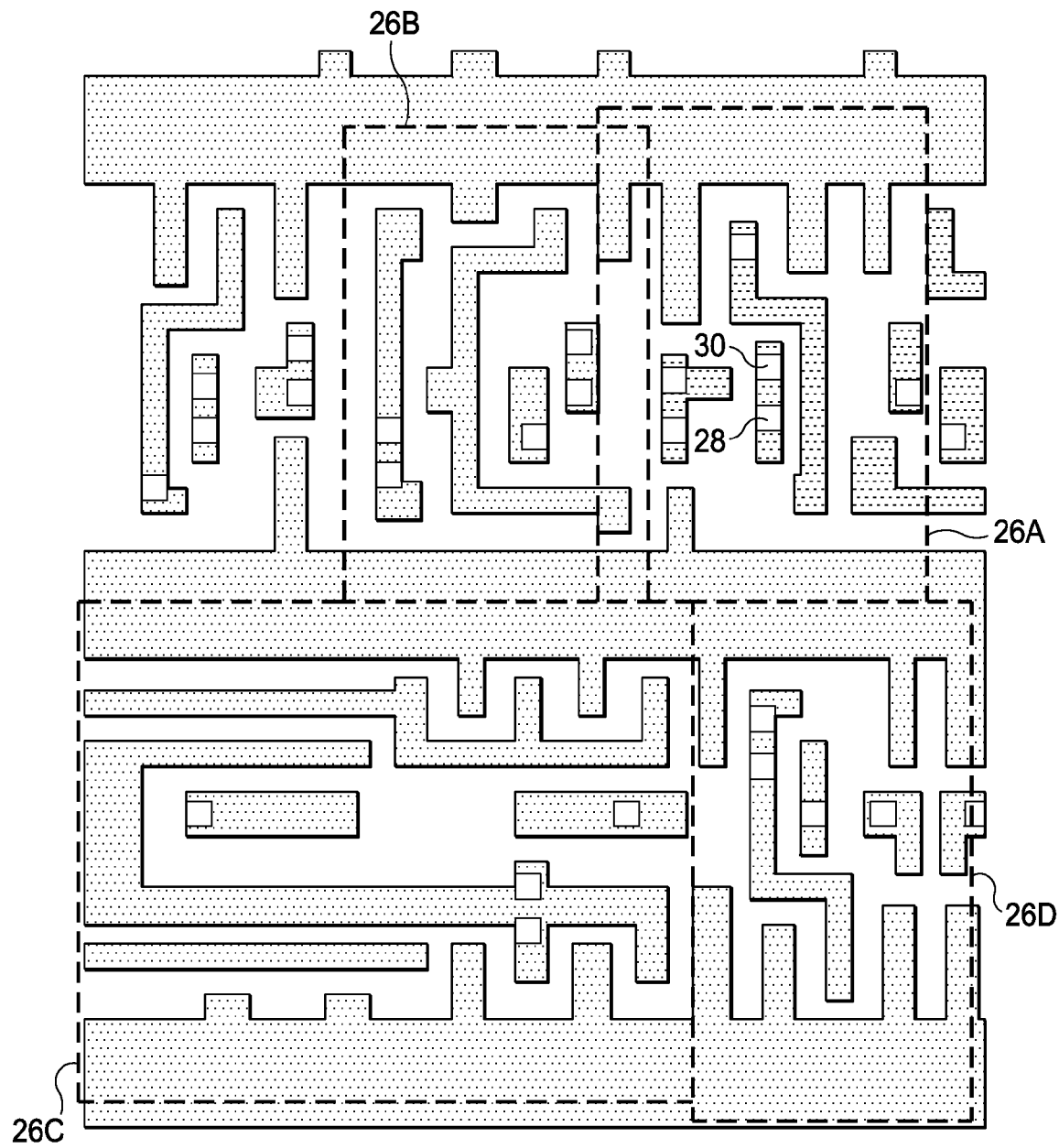
FIG. 5 illustrates a top view of an exemplary failure die, with failure candidate nodes in the failure die being determined.

After the failure candidate nodes are identified, an automatic net tracing (step 16) may be performed on each of the failure candidate nodes. FIG. 5 schematically illustrates a top view of a part of a failure die. Black squares represent nodes such as drains of transistors. The nodes may be named for the identification purpose. Four quadrants 26A, 26B, 26C, and 26D are shown as being in the illustrated die region. During the step of identifying the failure candidate nodes (step 14 in FIG. 4), the failure candidate nodes and the respective quadrants may be identified. For example, quadrants 26B, 26C, and 26D may be found as not including any failure candidate nodes therein, while quadrant 26A may include failure candidate nodes 28 and 30. The automatic net tracing (step 16 in FIG. 4) may then be performed starting from each of failure candidate nodes 28 and 30. Typically, the tracing from each of failure candidate nodes may finish quickly. However, to improve the performance, the automatic net tracing from a failure candidate node may be stopped if the time used for the tracing exceeds certain time limit, even if the failure site associated with the failure candidate node has not been found yet.

The automatic net tracing may be performed by a software, which may further be run on a computer. Further, the automatic net tracing may be performed through analyzing the electrical data, which may be stored in the CP data log, rather than physically tracing the lines. For example, referring to FIG. 3, if a failure site is at point 220, then all metal lines 212 and vias 214 in metal layers higher than point 220 may not carry the same signal as node 206, while metal lines 212 and vias 214 in metal layers below point 220 will carry the signal at node 206. Accordingly, failure site 220 can be identified, or at least, it may be found that the failure associated with failure candidate node 206 does not occur in metal layers M1 and M2. With the high efficiency of the automatic net tracing, it is possible to trace all failure candidate nodes in all failure dies, and the possibility of finding the major failure is high.

Referring back to FIG. 4, as shown as step 18, the automatic net tracing results from the failure dies are analyzed, either automatically by a software running on a computer and/or manually. The analysis, also referred to as a top layer analysis hereinafter, generates a statistic result. The failure layer analysis includes a top metal analysis (TMA) using an TMA algorithm, and a defect simulated-path analysis (DSA) using a DSA algorithm.

Figure 6:
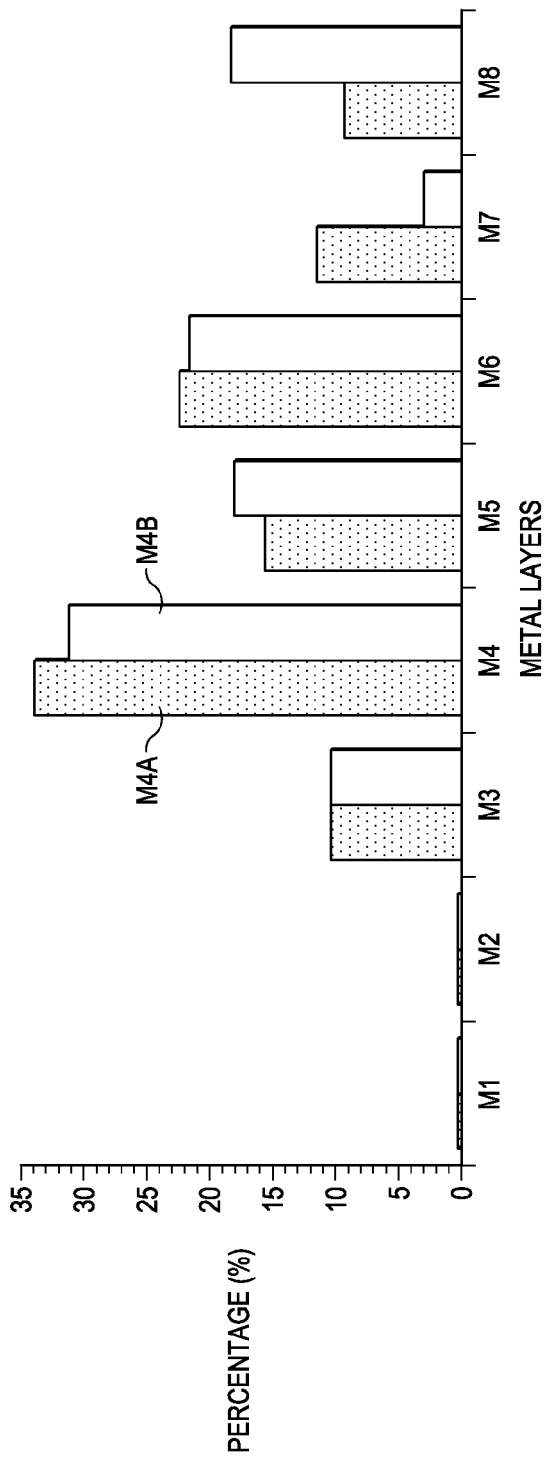
FIG. 6 illustrates a bar chart illustrating percentages of top metal layers in each of metal layers compared to that of benchmarks, wherein the top metal layers are highest metal layer that have metal lines electrically coupled to the respective failure candidate nodes.

In the TMA, all the automatic net tracing results are compiled as a statistic to help find the highest metal layer (a top metal layer), wherein a significant, or even a majority of, the failure dies have failure sites in the top metal layer or in metal layers over the top metal layer. Please note that the top metal layer may not necessarily be metal layer Mtop as shown in FIG. 3. For example, referring to FIG. 3, starting from failure candidate node 206, the electrical connection may be traced to metal layers M1, M2, and M3, but not to M4, due to break point 220, then the top metal layer is M3. FIG. 6 illustrates a bar chart illustrating a result of the TMA. The X-axis represents metal layers, and the Y-axis represents the percentage of failure candidate nodes. For each metal layer, there are two bars. The bar on the left indicates the results obtained from a benchmark die(s), while the bar on the right indicates the results obtained from the failure dies. For example, if a normal yield in the manufacturing of the dies is 90 percent, and is dropped to 70 percent. The PFA needs to be performed to find out the major failures causing the yield to drop from 90 percent to 70 percent. Accordingly, dies from wafers with the 90 percent yield are used as benchmarks. In the exemplary result as shown in FIG. 6, it is found that only about 10 percent of failure candidate nodes have top metal layers in M3 or under. Since 10 percent is not a significant value, the dies associated with the bars corresponding to metal layers M1, M2, and M3 will be excluded from PFA samples since they are unlikely to include the major failures. The failure dies associated with the bars corresponding to M4 and above are thus candidates that may be selected as PFA samples. Further, it is found that there is a noticeable difference between the percentage of the benchmark (M4A) and the percentage of failure dies (M4B) for metal layer M4. Therefore, it may be determined that the major failure may occur in metal layer M4 or over. Further, the dies causing the drop from M4A to M4B may include the major failures, and the failure dies associated with bar M4B are candidates that may be selected as PFA samples.

Figure 7:
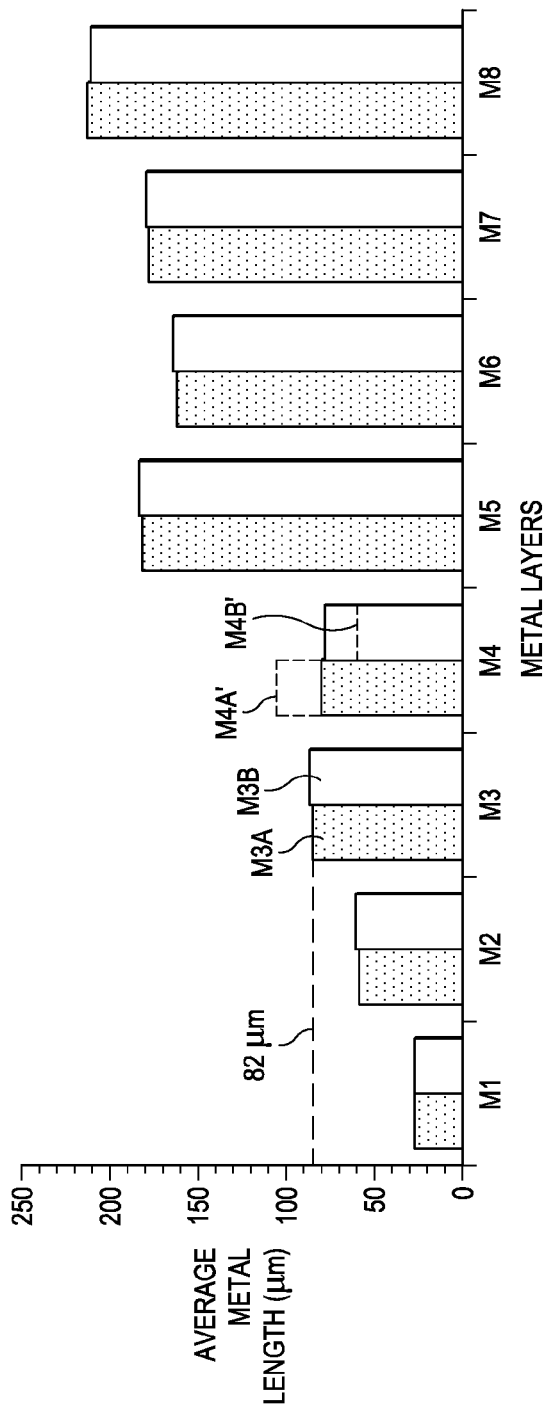
FIG. 7 illustrates a bar chart illustrating average lengths of metal lines in each of metal layers compared to that of benchmarks, wherein the metal lines are electrically coupled to the failure candidate nodes.

FIG. 7 illustrates a bar chart illustrating a result of the DSA. The X-axis represents metal layers, and the Y-axis represents the average lengths of metal lines in the respective metal layers, which metal lines are electrically coupled to the failure candidate nodes. Apparently, if a major failure occurs in a metal line, the length of the metal line is shortened. For example, referring to FIG. 3, if a major failure occurs at position 220, then the length of the respective metal line 212 in metal layer M3 is reduced from L1 to L2. Further, if a major failure occurs in a metal layer, the average length of the metal lines in the metal layer and electrically coupled to the failure candidate nodes will also be shortened. Conversely, although minor failures may also cause a metal line to be shortened. The average metal line length for multiple failure dies may not be noticeably reduced. Accordingly, comparing the average lengths of metal lines in benchmark dies/wafer to the average lengths of metal lines in the failure dies may indicate which metal layer the major failure occurs in, and which failure dies are possibly associated with the major failure, and are candidates of PFA samples.

The result shown in FIG. 7 are obtained by calculating (from the CP data log) and averaging lengths of all metal lines in the dies to obtain die averages, and then make an average for all the die averages in the same wafer. In alternative embodiments, different method of averaging may be used. Again, for each metal layer, there are two bars. The bar on the left indicates the results obtained from benchmark dies, while the bar on the right indicates the results obtained from the failure dies. For example, the M3 bars correspond to 82 μm. This represents that all the metal lines in the failure dies and electrically coupled to the failure candidate nodes have the average length of 82 μm. With bars M3A of the benchmark dies and M3B of the failure dies having equal lengths, it may be concluded that the major failures do not occur in metal layer M3. In the exemplary result as shown in FIG. 7, it is found that in each of all metal layers, the benchmark metal length is equal to that of failure dies in the same metal layer. This indicates that the major failure may occur under the metal layers. However, if a noticeable difference occurs as illustrated using dotted lines M4A' and M4B', then it may be determined that the major failure occurs in metal layer M4, and the respective failure dies associated with bar M4B' are likely PFA candidates, and may be selected as PFA samples.

Referring again back to FIG. 4, in step 20, with the results of the layer analysis, a software may be used to automatically select PFA sample dies and failure sites without the intervention of engineers. The PFA sample dies may include all, or a portion of the candidates identified through the TMA and DSA. A PFA is then performed to the selected PFA samples and the failure sites (step 22). Since the PFA samples are selected in such a way that the selected PFA samples and the respective failure sites therein are associated with the major failures, it is very likely that the PFA results obtained from the PFA samples are convergent, and the major failure may be verified.

In the embodiments, an automatic net tracing algorithm may be used to enable net tracing from failure candidate nodes. The improvement in the efficiency thus may result in an analysis of all failure dies and all failure candidate nodes. The analysis is thus complete and the PFA cycle time is low. The time-to-market is also reduced. Further, the hit rate of major failure is also high due to the fact that more samples may be analyzed, and the results will be more convergent.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
providing a plurality of failure dies;
performing a chip probing on the plurality of failure dies to generate a data log comprising electrical characteristics of the plurality of failure dies;
performing an automatic net tracing using a computer to trace failure candidate nodes in the plurality of failure dies, wherein the automatic net tracing is performed by analyzing electrical signals of nodes that are intended to connect to the failure candidate nodes, and wherein the electrical signals are retrieved from the data log;
performing a failure layer analysis on results obtained from the automatic net tracing, wherein the failure layer analysis is performed using a computer; and
selecting physical failure analysis (PFA) samples from the plurality of failure dies using results obtained in the step of performing the failure layer analysis.

2. The method of claim 1, wherein each of the failure candidate nodes is associated with at least one failure site.

3. The method of claim 1, wherein the failure candidate nodes are drains of transistors.

4. The method of claim 1 further comprising:
performing a scan diagnosis to simulate the electrical characteristics of the plurality of failure dies; and
analyzing the data log and results obtained in the scan diagnosis to generate the failure candidate nodes.

5. The method of claim 1, wherein the step of performing the failure layer analysis comprises a defect simulated-path analysis, wherein first average lengths of metal lines electrically coupled to the failure candidate nodes are compared to second average lengths of metal lines in a benchmark wafer to find a metal layer comprising a major failure occurred in the plurality of failure dies.

6. The method of claim 5 further comprising selecting a first portion of the plurality of failure dies causing a difference between the first average lengths and the second average lengths as PFA samples, wherein a second portion of the plurality of failure dies not causing the difference is not selected as PFA samples.

7. The method of claim 1, wherein the step of performing the failure layer analysis comprises a top metal analysis for determining a top metal layer, wherein major failures in the plurality of failure dies occur in the top metal layer or metal layer over the top metal layer.

8. The method of claim 7, wherein in the step of selecting PFA samples, a portion of the plurality of failure dies whose failure sites are under the top metal layer is excluded from the PFA samples.

9. The method of claim 1, wherein a part of the nodes in the plurality of failure dies are obtained through hot spot identification performed on the plurality of failure dies.

10. The method of claim 1, wherein the step of selecting PFA samples is performed automatically.

11. A method comprising:
providing a plurality of failure dies;
performing a chip probing on the plurality of failure dies to generate a data log comprising electrical characteristics of the plurality of failure dies;
finding failure candidate nodes in the plurality of failure dies, wherein each of the failure candidate nodes is associated with at least one failure site;
performing a net tracing using a computer to trace each of the failure candidate nodes, wherein the net tracing is performed by analyzing electrical signals of nodes that are intended to connect to the failure candidate nodes, and wherein the electrical signals are retrieved from the data log;
performing a failure layer analysis on results obtained from the net tracing, wherein the failure layer analysis is performed using a computer; and
selecting physical failure analysis (PFA) samples from the plurality of failure dies using results obtained in the step of performing the failure layer analysis.

12. The method of claim 11, wherein the failure candidate nodes are drains of transistors.

13. The method of claim 11 further comprising:
performing a scan diagnosis to simulate the electrical characteristics of the plurality of failure dies; and
analyzing the data log and results obtained in the scan diagnosis to generate the failure candidate nodes.

14. The method of claim 11, wherein the step of performing the net tracing is performed automatically.

15. The method of claim 11, wherein the step of selecting PFA samples is performed automatically.

16. The method of claim 11, wherein the step of performing the failure layer analysis comprises:
a top metal analysis for excluding a first portion of the plurality of failure dies as the PFA samples, and for selecting a second portion of the plurality of failure dies as candidates of the PFA samples; and
a defect simulated-path analysis for selecting a third portion of the plurality of failure dies as candidates of the PFA samples.

17. A method comprising:
providing a plurality of failure dies;
performing a chip probing on the plurality of failure dies to generate a data log comprising electrical characteristics of the plurality of failure dies;
performing a scan diagnosis to simulate the characteristics of the plurality of failure dies;
analyzing the data log and results obtained in the scan diagnosis to generate failure candidate nodes, wherein each of the of the failure candidate nodes is associated with at least one failure site;
performing an automatic net tracing using a computer to trace all failure candidate nodes in all of the plurality of failure dies, wherein the automatic net tracing is performed by analyzing electrical signals of nodes that are intended to connect to the failure candidate nodes, and wherein the electrical signals are retrieved from the data log;
performing a failure layer analysis on results obtained from the automatic net tracing, wherein the failure layer analysis is performed using a computer; and
automatically selecting physical failure analysis (PFA) samples from the plurality of failure dies using results obtained in the step of performing the failure layer analysis.

18. The method of claim 17, wherein the failure candidate nodes are drains of transistors.

19. The method of claim 17, wherein the step of performing the failure layer analysis comprises:
a top metal analysis for excluding a first portion of the plurality of failure dies as the PFA samples, and for selecting a second portion of the plurality of failure dies as candidates of the PFA samples; and
a defect simulated-path analysis for selecting a third portion of the plurality of failure dies as candidates of the PFA samples.

20. The method of claim 17, wherein a part of the failure candidate nodes are obtained through hot spot identification performed on the plurality of failure dies.

* * * * *